United States Patent [19]
Tamarkin

[11] Patent Number: 5,903,439
[45] Date of Patent: May 11, 1999

[54] MEZZANINE CONNECTOR ASSEMBLY

[75] Inventor: Vladimir K. Tamarkin, Huntingdon Valley, Pa.

[73] Assignee: Unisys Corporation, Blue Bell, Pa.

[21] Appl. No.: 09/080,880

[22] Filed: May 18, 1998

[51] Int. Cl.[6] .................................................... H05K 1/14
[52] U.S. Cl. ........................ 361/742; 361/770; 361/788; 361/790; 361/804; 174/138 G
[58] Field of Search .................... 361/742, 770, 361/788, 790, 804, 684, 686, 785; 174/138 G; 439/69, 74

[56] References Cited

U.S. PATENT DOCUMENTS

| | | | |
|---|---|---|---|
| 3,836,703 | 9/1974 | Coules | 361/804 |
| 3,852,849 | 12/1974 | Pestka | 361/804 |
| 4,495,548 | 1/1985 | Matsui | 361/790 |
| 5,259,783 | 11/1993 | Hileman et al. | 439/74 |
| 5,628,637 | 5/1997 | Pecone et al. | 439/74 |
| 5,675,472 | 10/1997 | Hamerton-Kelly | 361/684 |

*Primary Examiner*—Leo P. Picard
*Assistant Examiner*—John B. Vigushin
*Attorney, Agent, or Firm*—Mark T. Starr; Steven B. Samuels; Ratner & Prestia

[57] ABSTRACT

A mezzanine connector assembly includes connectors engageable to a mating connector assembly such as a motherboard. It includes a circuit card having a surface on which a connector is mounted as well as a mezzanine card having a surface on which another connector is mounted. A mounting member is attached for connection between the cards in order to establish relative positions of the card surfaces. The distance between the card surfaces is set at least in part by the distance between end portions of the mounting member. The distance between the card surfaces is independent of the thickness of the cards so that a variation of the thickness of the cards will not result in a variation of the distance between the card surfaces.

25 Claims, 5 Drawing Sheets

MEZZANINE CONNECTOR ASSEMBLY

FIELD OF THE INVENTION

This invention relates to a circuit card assembly and, in particular, to a mezzanine connector assembly having connectors that are aligned for engagement to a mating connector assembly.

BACKGROUND OF THE INVENTION

Requirements for input/output ("I/O") pin connections between circuit cards and motherboards often exceed the available circuit card edge length and exceed the maximum available connector pin density. One solution to this problem is the use of a supplemental card portion (i.e., a so-called "mezzanine" card or "daughter" card) that is mounted to the main circuit card in order to provide one or more additional connectors and additional I/O pins. Such mezzanine cards are also used whenever multiple circuit cards are advantageously interconnected for connection to a motherboard, for any reason.

It has been discovered, however, that the use of such mezzanine cards can create an additional challenge because the connectors on the main circuit card and the mezzanine card must be spaced at a carefully controlled distance so that the circuit card and mezzanine card connectors can be mated properly with the mating connectors that are positioned on the motherboard. The spacing between the connectors on the circuit card and the mezzanine card must therefore be held to a relatively tight tolerance in order to ensure proper connection to the motherboard without undo interference. In fact, the required dimensional tolerance for the relative positions of the circuit card connectors, which of course depends on the particular connector system selected, can be as small as about +/−0.002", or even smaller. When these dimensional tolerances are not met, significant structural problems can arise.

It is particularly difficult to maintain such a tight tolerance in view of the fact that the boards used to create the circuit card and the mezzanine card are often formed from a multi-layer substrate. It has been discovered that such substrates can have a typical thickness tolerance of up to about +/−0.007", or even more. The significant variations in the thickness of the circuit card and the mezzanine card present a significant problem for conventional mezzanine connector assemblies.

An example of a conventional mezzanine connector assembly is illustrated in FIG. 1 and is designated by the numeral "10." It has a circuit card 12 and a mezzanine card 14 spaced apart from one another by a conventional standoff 16. Screws 18, 20 engage circuit card 12 and mezzanine card 14 adjacent to the end surfaces of spacer 16. The length of spacer 16 is indicated in FIG. 1 as "$L_1$."

Circuit card 12 has an upper surface 13a and a lower surface 13b, and mezzanine card 14 has an upper surface 15a and lower surface 15b. Upper and lower ends of spacer 16 abutt against lower surface 15b of mezzanine card 14 and against upper surface 13a of circuit card 12, respectively. The length $L_1$ of spacer 16 sets the distance between upper surface 13a of circuit card 12 and lower surface 15b of mezzanine card 14.

The tolerance of length $L_1$ of spacer 16 can be carefully controlled by standard machining processes. However, the thickness $T_{12}$ of circuit card 12 and the thickness $T_{14}$ of mezzanine card 14 can vary from card-to-card or even at various positions on a single card. This is especially true when a laminated, multi-layered card is used. For example, multi-layered copper clad board is formed from a multi-layered substrate with copper coatings on the facing surfaces of the substrate. The substrate itself (such as so-called "FR 4" board, for example) is often formed from layers of glass fiber mesh impregnated by epoxy. Such fiber reinforced boards have been known to vary within a broad thickness tolerance up to or even exceeding about +/−0.007".

In view of the tolerances contributed by the thickness of the circuit card 12 and/or the mezzanine card 14, the distance $D_1$ (between upper surface 13a of circuit card 12 and upper surface 15a of mezzanine card 14) is difficult to control within a tight tolerance. If spaced connectors are mounted on upper surface 13a of circuit card 12 and on upper surface 15a of mezzanine card 14, then the spacing of those connectors will vary depending upon the actual thickness $T_{14}$ of mezzanine card 14. In other words, distance $D_1$ is the combined distance of length $L_1$ of spacer 16 and thickness $T_{14}$ of mezzanine card 14, and the dimensional tolerances of the spacer 16 and mezzanine card 14 are cumulative. Accordingly, variations in the thickness $T_{14}$ of mezzanine card 14 contribute to variations of the spacing between connectors mounted on surfaces 13a and 15a.

The same problem arises with respect to the distance $D_2$ (between lower surface 15b of mezzanine card 14 and lower surface 13b of circuit card 12) because of the built-up of tolerances resulting from length $L_1$ of spacer 16 and the thickness $T_{12}$ of circuit card 12. This variation would therefore contribute to variations of the spacing between connectors mounted on surfaces 13b and 15b. A further accumulation of tolerances would result if connectors were mounted on surfaces 13b and 15a because two substrate thicknesses ($T_{12}$ and $T_{14}$) would contribute to the overall distance between those surfaces.

OBJECTS OF THE INVENTION

It is a primary object of this invention to overcome the disadvantages associated with conventional circuit card assemblies.

It is a further object of this invention to provide a circuit card assembly having connectors aligned for engagement to a mating connector assembly.

Other objects of the invention will be apparent in view of the following description.

SUMMARY OF THE INVENTION

This invention provides a circuit card assembly, such as a mezzanine connector assembly, having connectors that can be engaged to a mating connector assembly such as a motherboard. The circuit card assembly includes a main card portion with a surface on which a connector is mounted. It also includes a card portion, such as a mezzanine card, that is spaced from the main card portion and that has a card surface on which a supplemental connector is mounted.

A mounting member is attached between the card portions in order to establish the relative positions of the two card surfaces. The mounting member includes an end portion extending adjacent to one card surface and an opposite end portion extending adjacent to the other card surface.

The distance between the card surfaces is set, at least in part, by the distance between the end portions of the mounting member. The distance between the card surfaces is independent of the thickness of the card portions so that any variation of the thickness of the card portions will not result in a variation of the distance between the card surfaces or the spacing between connectors mounted on the card surfaces.

According to a preferred aspect of the invention, the mounting member includes a spacer having a body and a support such as a flange connected adjacent to the spacer's body. The support has a surface that is positioned along the plane of a card portion's surface. The distance between the support's surface and the other end of the spacer's body is set to establish a desired distance between the card surfaces. The circuit card assembly according to this invention therefore eliminates the dimensional variations that would otherwise be contributed by variations in the thickness of the card substrates.

DETAILED DESCRIPTION OF THE INVENTION

Figure 1:
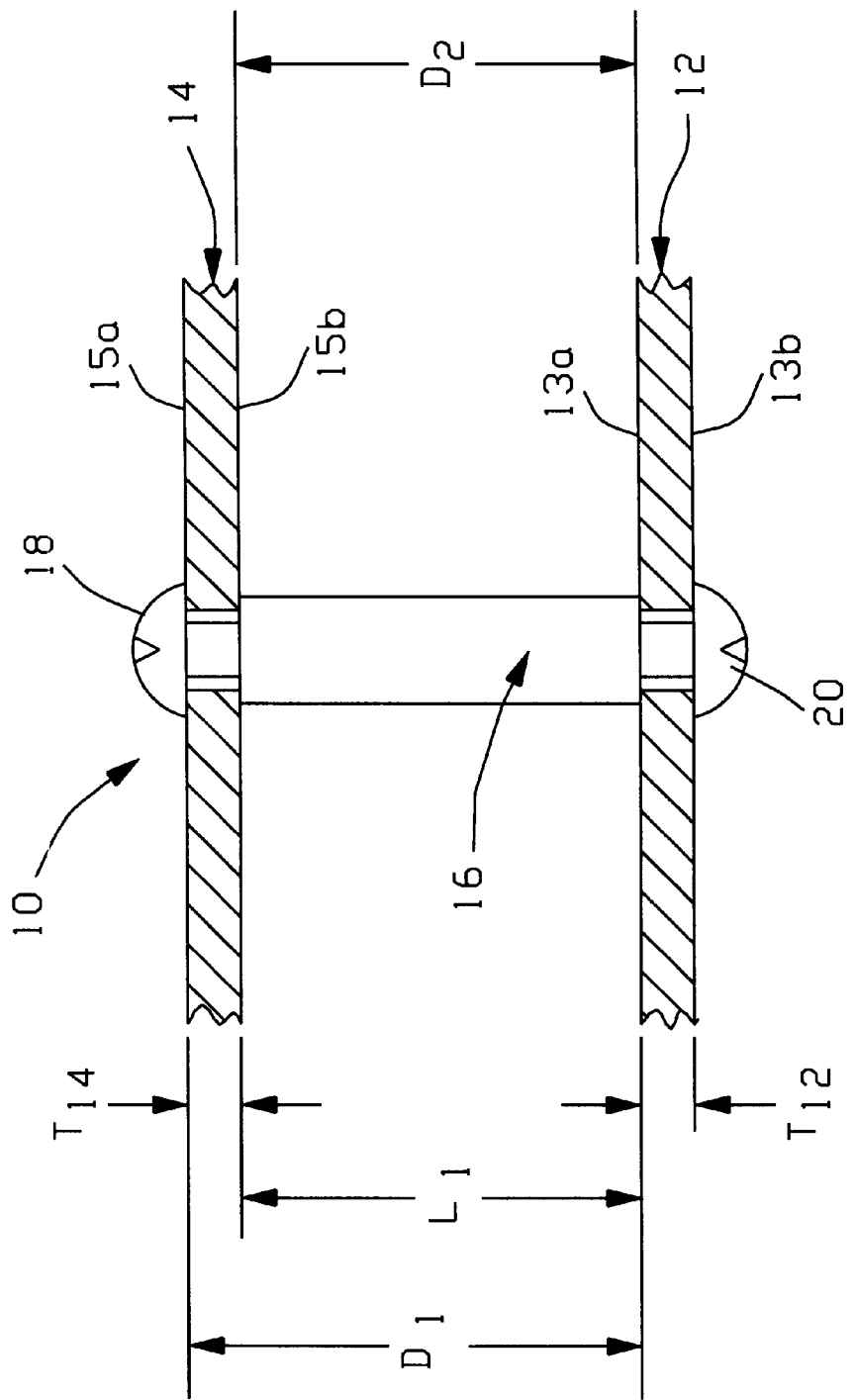
FIG. 1 is a cross-sectional side view of a portion of a conventional circuit card assembly.

The invention will now be described with reference to specific embodiments selected for illustration in the drawings. It will be appreciated that the invention is not limited to the embodiments selected for illustration and that the drawings are not to any particular scale or proportion. The invention is defined separately in the appended claims.

Although the invention is not so limited, the exemplary embodiments illustrated herein relate to a mezzanine connector assembly wherein connectors are mounted on a top surface of a circuit card. As described earlier, in a conventional mezzanine card configuration, the spacing between the connector mounted on the circuit card and the connector mounted on the mezzanine card is affected by the length tolerance of the mounting hardware (such as a standoff or a spacer) as well as the thickness tolerance of the mezzanine card itself, as shown in FIG. 1. While the standoff length tolerance can be controlled relatively easily (i.e., down to about +/−0.001," or even less), a multi-layer laminated mezzanine card substrate can contribute up to or even more than about +/−0.007" to the overall tolerance of the mezzanine connector location.

According to exemplary embodiments of this invention, a spacer is attached adjacent to the same card surfaces on which the respective connectors are mounted. To accomplish this, the spacer can be attached to the mezzanine card indirectly: the spacer is first attached to a support such as a flange or plate, and the support is then attached to the mezzanine card at the same card surface to which the connector is attached. The support is attached firmly to the surface of the mezzanine card, thus the seating plane for the spacer coincides with the same mezzanine card surface on which the connector is mounted. This eliminates the mezzanine card as a tolerance contributor and only the tightly controlled spacer tolerance impacts the position of the mezzanine connector. Accordingly, this invention makes it possible to use mezzanine cards for an I/O connector expansion in cases where connector location tolerance is critical.

Figure 2:
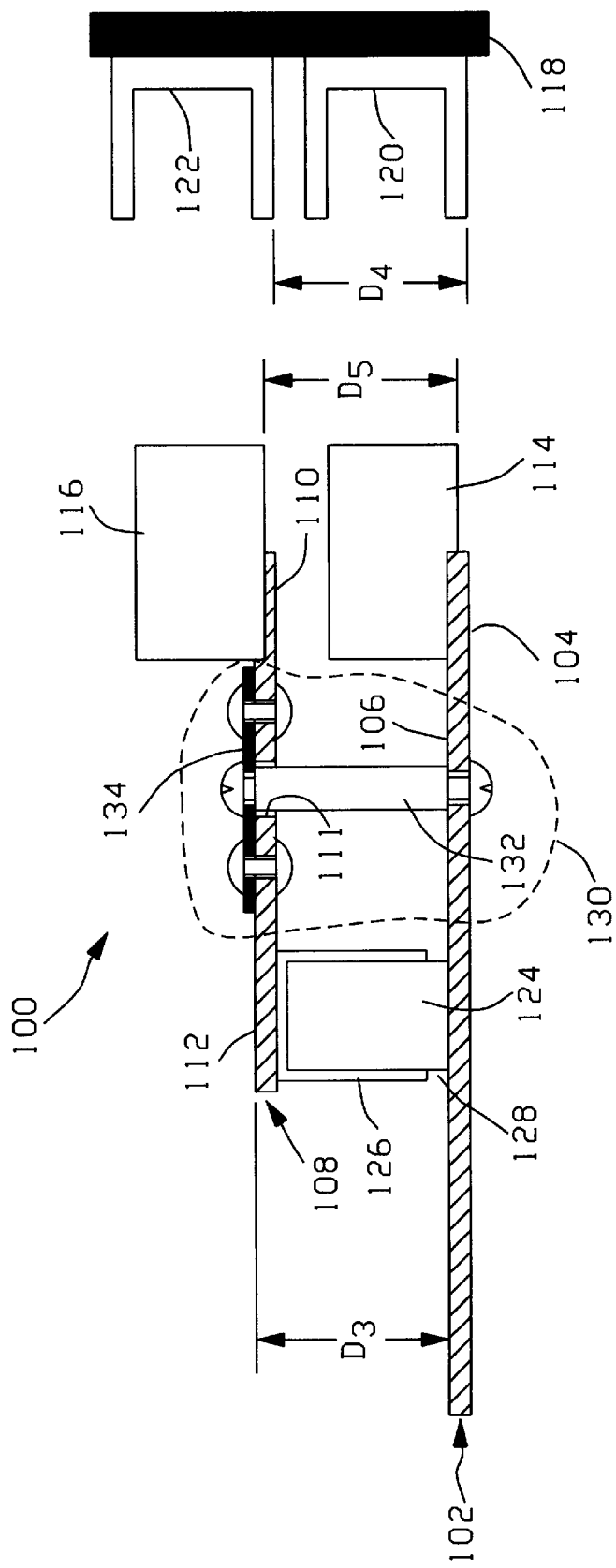
FIG. 2 is a cross-sectional side view of an embodiment of a circuit card assembly according to this invention.
Figure 3:
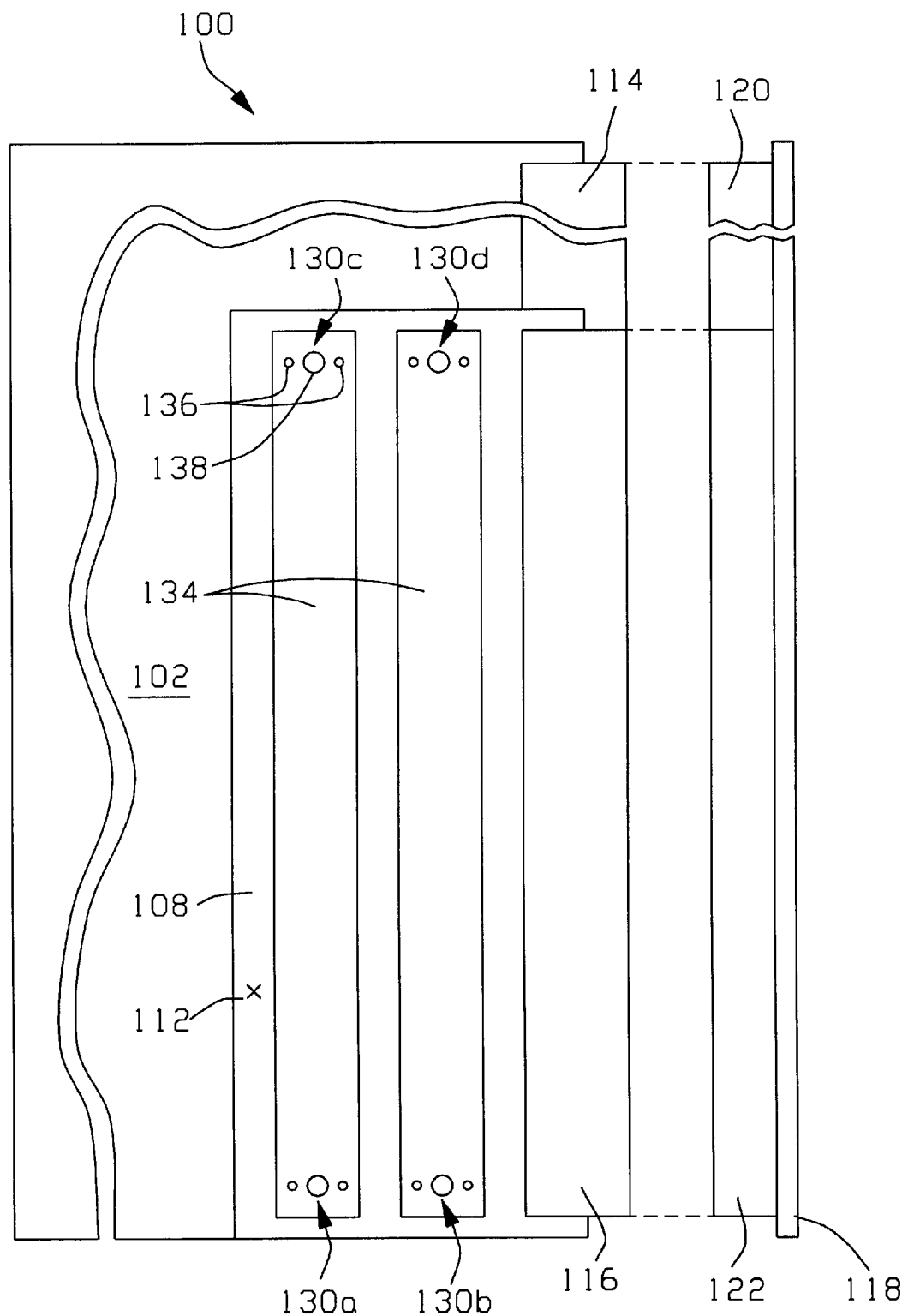
FIG. 3 is a top view of the circuit card assembly illustrated in FIG. 2.
Figure 4:
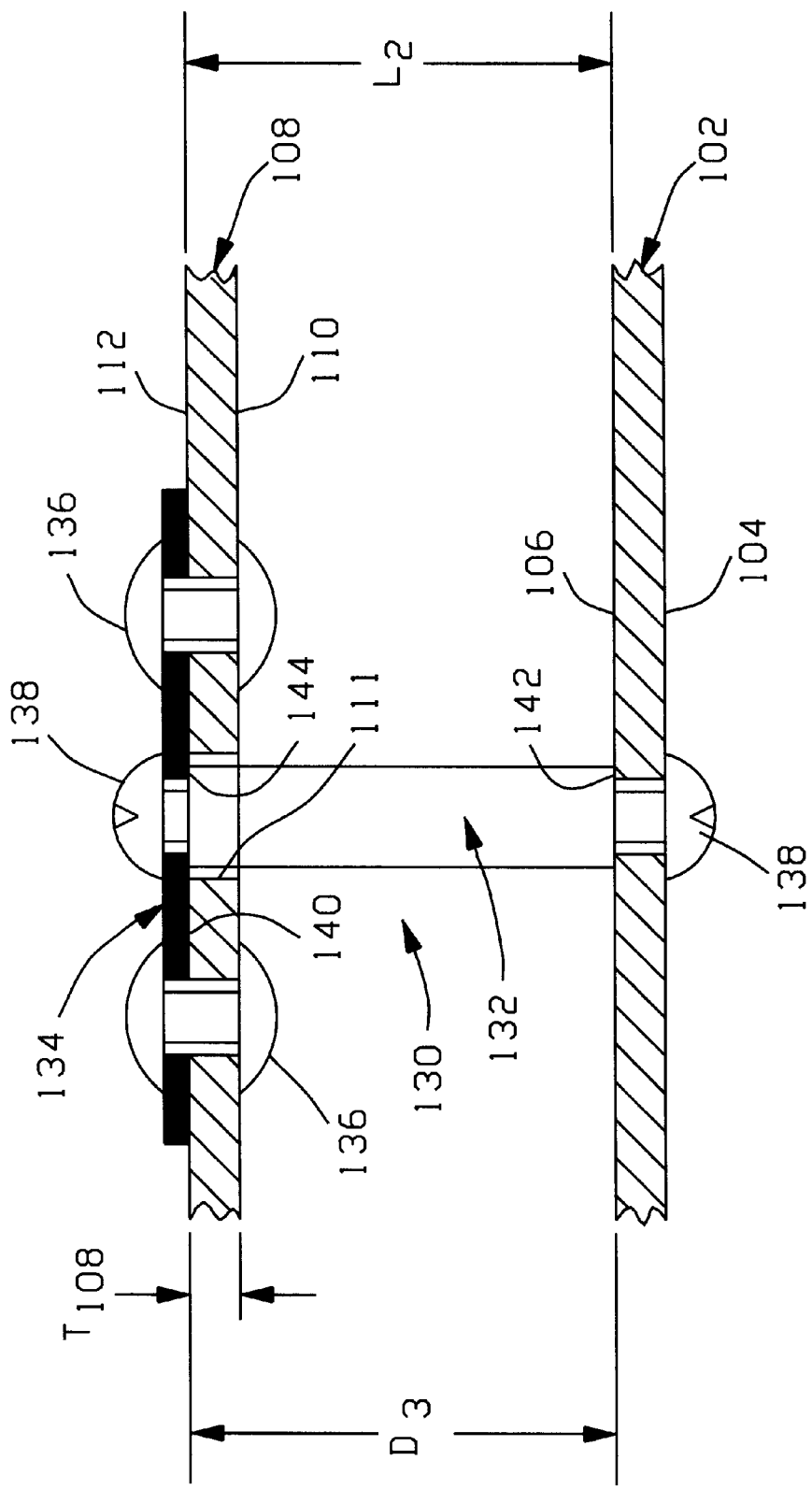
FIG. 4 is a cross-sectional side view of a portion of the circuit card assembly illustrated in FIG. 2.

Referring now to FIGS. 2 through 4, an exemplary embodiment of the invention will now be described. As shown in the side view provided in FIG. 2, a circuit card assembly (or mezzanine connector assembly) designated "100" has a card portion in the form of a circuit card (or circuit board) 102 and a spaced card portion in the form of a mezzanine card (or daughter board) 108. Circuit card 102 and mezzanine card 108 are separate card portions of circuit card assembly 100 and are formed from a conventional substrate which can be a multi-layer board such as "FR4" having glass fiber mesh layers impregnated by epoxy. The substrates of circuit card 102 and mezzanine card 108 can be copper clad, depending upon the application. Such a substrate can also be referred to as so-called "green board."

Circuit card 102 has a lower surface 104 and an upper surface 106. Similarly, mezzanine card 108 has a lower surface 110 and an upper surface 112. Extending between upper and lower surfaces 112 and 110 of mezzanine card 108 is an opening 111.

Mounted on the upper surface 106 of circuit card 102 is a primary connector 114. Connector 114 is considered to be the primary connector because it is a part of the circuit card 102 and most frequently has the majority of pin connections. Referring to FIG. 3 for example, primary connector 114 extends along substantially the entire edge of circuit card 102. A secondary connector 116 is mounted on an upper surface 112 of mezzanine card 108. This connector 116 is considered to be secondary because it is often shorter in length than primary connector 114 and, therefore, has a smaller number of pin connections.

A motherboard 118, also having a substrate, is provided with a primary motherboard connector 120, as well as a secondary motherboard connector 122. Primary circuit card connector 114 is positioned for engagement with primary motherboard connector 120, and secondary mezzanine connector 116 is positioned for mating connection with secondary motherboard connector 122. In FIG. 2, primary connector 114 and secondary connector 116 are shown as female connectors and primary motherboard connector 120 and secondary motherboard connector 122 are shown as male connectors (although the connector pins are not shown). Nevertheless, the positioning of male and female connectors is unimportant and the male connectors can be substituted with the female connectors and vice-a-versa.

The primary connector 114 and secondary connector 116 are commonly referred to as "right angle" connectors because they make a connection from the respective circuit cards and extend leads upwardly and then horizontally from the circuit cards shown in FIG. 2. Taken together, connectors 114, 116, 120, and 122 form a connector system. Many known connector systems are available such as, for example, the HDM™ connector system available from Teradyne, Inc. of Nashua, N.H. Other types of connectors can be substituted.

It is advantageous to optimize the relative positions of connectors such as primary connector 114 and secondary connector 116 in order to reduce the interference that can otherwise be experienced when the connectors are mated with the motherboard connectors 120 and 122. If the spacing of the primary and secondary connectors 114 and 116 deviates significantly from a nominal spacing that corresponds to the spacing of the motherboard connectors 120 and 122, then there will be misalignment between the pins of the male connectors and the mating recesses of the female connectors. Misalignment can increase the insertion forces required to mate the connectors. In some instances, misalignment can result in the inability to mate the connectors at all. This problem is especially acute when there are a very large number of pins in the connectors. For example, an assembly such as the one shown in FIGS. 2 and 3 can have as many as 2,000 pins or even more. It will be appreciated that such a system requires a high insertion force as well as high density connectors with many pins located within a small cross-sectional area. For such connector systems, the alignment of mating connectors is especially critical.

A circuit card interface connector 124 (a female connector as shown in FIG. 2) is mounted on the upper surface 106 of circuit card 102. It mates with a mezzanine card interface connector 126 (a male connector as shown in FIG. 2) that is mounted on the lower side 110 of mezzanine card 108. Connectors 124 and 126 provide the necessary electrical connection between circuit card 102 and mezzanine card 108. A clearance space 128 is provided to ensure that interface connector 124 fully engages interface connector 126. Such engagement could be prevented if premature contact is made between an edge surface of interface connector 126 and the upper surface 106 of circuit card 102 before interface connector 124 is fully engaged within interface connector 126.

An exemplary embodiment of a mounting assembly will now be described with reference to FIGS. 2, 3, and 4. Referring first to FIG. 2, a mounting assembly 130 includes a longitudinally extending mounting member 132 such as a standoff or spacer or other suitable mounting hardware. Mounting assembly 130 also includes a substantially flat support plate 134 that acts as a support portion or support member that is associated with, and connected adjacent to, mounting member 132. Support 134 can be integrally formed with mounting member 132 (see FIG. 6, for example). As shown in FIG. 2, mounting member 132 extends upwardly through the opening 111 provided in mezzanine card 108. Mounting member 132 can be formed from any suitable metallic or polymeric material and can be provided with a circular cross-sectional shape although other cross-sectional shapes can be used as well. Support 134 likewise can be formed from a wide variety of suitable materials, whether metallic or polymeric, and can be provided with a wide variety of shapes and sizes.

Referring now to FIG. 4, support 134 is engaged against the upper surface 112 of mezzanine card 108 by means of mechanical fasteners such as rivets 136, 136. Rivets are one of many possible means for engaging support 134 to mezzanine card 108 and other mechanical means for engaging these components are of course contemplated. A screw 138 provides engagement between mounting member 132 and support 134. As is clearly shown in FIG. 4, a lower contact surface 140 of support 134 rests against and abuts upper surface 112 of mezzanine card 108. In other words, lower surface 140 of support 134 shares the same plane as upper surface 112 of mezzanine card 108.

Mounting member 132 has an end portion defining an end surface 142 (a lower end in FIG. 4) and an opposite end portion defining an end surface 144 (an upper end in FIG. 4). End surfaces 142 and 144 can be considered contact surfaces, as will be described. As measured between end surface 142 and opposite end surface 144, mounting member 132 has a length of $L_2$. End surface 142 of mounting member 132 rests against and abuts an upper surface 106 of circuit card 102. A screw 138 makes the necessary connection.

Also, opposite end surface 144 of mounting member 132 abuts against the lower surface 140 of support 134. Because opposite end surface 144 is flush with lower surface 140, and lower surface 140 is flush with upper surface 112, it will be appreciated that opposite end surface 144 of mounting member 132 is flush with upper surface 112 of mezzanine card 108. In other words, opposite end surface 144 of mounting member 132 is aligned with the plane defined by upper surface 112 of mezzanine card 108.

The distance between upper surface 106 of circuit card 102 and the upper surface 112 of mezzanine card 108 is designated "$D_3$" in FIGS. 2 and 4. Also, as illustrated in FIG. 2, the distance between the bottom surfaces of motherboard connectors 120 and 122 is designated "$D_4$" and the distance between the bottom surfaces of primary connector 114 and secondary connector 116 is designated "$D_5$." In view of the structure illustrated in detail in FIG. 4, these distances and the length of the mounting member 132 should all be equal. In other words, $L_2=D_3=D_4=D_5$.

It will be appreciated that the critical dimension $D_3$ between the upper surfaces of the card portions will not vary if the thickness $T_{108}$ of mezzanine card 108 should vary. Variations in thickness $T_{108}$ will not change dimension $D_3$ because the dimensions $T_{108}$ and $D_3$ are not cumulative. Instead, the length $L_2$ of mounting member 132 (i.e., the distance between end surfaces 142 and 144) sets the distance between card surfaces 106 and 112. Accordingly, only the length tolerance of mounting member 132 (perhaps as small as +/−0.001" or smaller) comes into play and the larger thickness tolerance of the mezzanine card 108 (perhaps as large as +/−0.007" or larger) is eliminated. This is a significant improvement over the prior art assembly shown in FIG. 1, which can lead to a tolerance for dimension $D_1$ of as much as +/−0.008", for example, if the length $L_1$ tolerance is +/−0.001" and the thickness $T_{14}$ tolerance is +/−0.007", because the length and thickness tolerances are cumulative.

If the thickness $T_{108}$ should change from one mezzanine card to another in mass production, then the dimension $D_3$ in the final assembly will not change and the alignment of connector assembly 114, 116, 120, and 122 will not be adversely affected. Likewise, if the thickness $T_{108}$ of the mezzanine card should vary even within the length or width of a particular card component, then the dimension $D_3$ in the final assembly will not vary along the connector's length and the alignment of connectors 114 and 116 with connectors 120 and 122 will remain intact.

Referring now to FIG. 3, circuit card assembly 100 is shown with a slight modification as compared to the side view shown in FIG. 2. Specifically, four mounting assemblies 130a–d are shown. Such a configuration can be advantageous when the connector assembly (114, 116, 120, and 122) includes a high density and large number of pins and, therefore, requires a high insertion force. Multiple mounting assemblies 130 then provide for additional stability. As shown in FIG. 3, two pairs of mounting assemblies (i.e., 130a and 130c, and 130b and 130d, for example) can share a single elongated support 134 extending across the upper surface 112 of mezzanine card 108. It is of course contemplated that, instead of one plate 134 extending between two or more mounting assemblies, each mounting assembly 130a–d can be provided with a separate, smaller support component. For example, a support in the form of a small washer can also be used for embodiments, like the FIG. 3 embodiment, that use separate, non-integral support components.

Although an exemplary embodiment of mounting assembly 130 has been illustrated in the drawings and described, it will be appreciated that many modifications and variations to the mounting assembly can be made without departing from the spirit and scope of this invention. Several examples of modified embodiments are illustrated in FIGS. 5–7.

Figure 5:
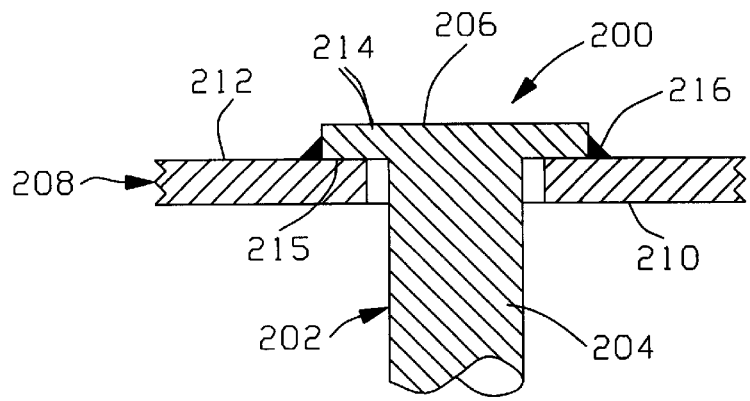
FIG. 5 is a cross-sectional side view of a portion of an embodiment of a mounting assembly according to this invention.

Referring to FIG. 5, a mounting assembly 200 includes a spacer 202 having a body portion 204 and an end portion 206. A mezzanine card 208 has a lower surface 210 and an upper surface 212. A support portion 214 of spacer 202 is provided adjacent to end portion 206. In this exemplary embodiment, support portion 214 extends radially outwardly from end portion 206 in order to provide a lower contact surface 215. This lower surface 215 abuts against the upper surface 212 of mezzanine card 208 so that the lower surface 215 of support 214 and upper surface 212 of mezzanine card 208 lie in substantially the same plane. An adhesive or bond or weld or the like is provided at 216. If a weld is used, it can be a metallic or polymeric weld depending on the materials used. Soldering is also contemplated. Such an engagement between support 214 and upper surface 212 provides a substantially integral means for engaging spacer 202 to mezzanine card 208 at end portion 206. In the embodiment illustrated in FIG. 5, it will be appreciated that the distance $D_3$ (FIGS. 2 and 3) will be defined by the distance from a bottom end portion of spacer 202 (not shown) and the lower surface 215 of support 214. That length will set distance $D_3$ and control the spacing of connectors 114 and 116 while eliminating any tolerance that could be contributed by the thickness of mezzanine card 208.

Figure 6:
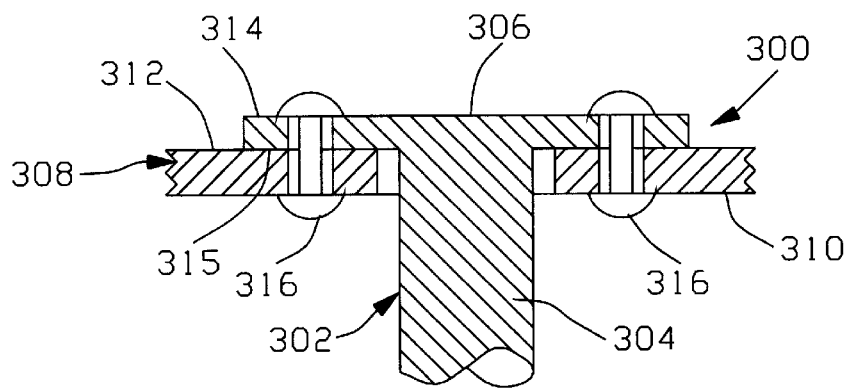
FIG. 6 is a cross-sectional side view of a portion of another embodiment of a mounting assembly according to this invention.
Figure 7:
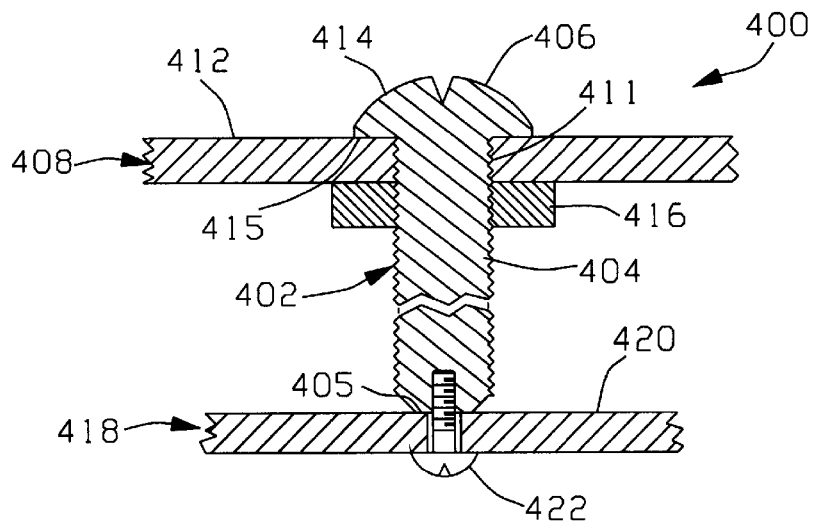
FIG. 7 is a cross-sectional side view of a portion of still another embodiment of a mounting assembly according to this invention.

Referring now to FIG. 6, a mounting assembly 300 is similar to mounting assembly 200 except for the means with which the end portion of the spacer is engaged to the mezzanine card. Specifically, spacer 302 has a body portion 304 and an end portion 306. A mezzanine card 308, having a lower surface 310 and an upper surface 312, abuts against a lower contact surface 315 of a support portion 314. This support portion 314, like support portion 214, extends radially outwardly from end portion 306 of spacer 302. As before, lower surface 315 of support portion 314 is flush, and shares a plane with, upper surface 312 of mezzanine card 308. A series of mechanical fasteners 316 such as rivets are provided to engage support portion 314 to mezzanine card 308, although other equivalent means for engaging these components are contemplated. For example, threaded and snap-fit and other mechanical fasteners can be used as well. As with mounting assembly 200, the distance $D_3$ defined in FIGS. 2 and 3 will be set by the distance between a bottom end portion (not shown) of spacer 302 and the lower surface 315 of support 314, thereby eliminating from distance $D_3$ any variation attributable to the thickness of mezzanine card 308.

The FIG. 6 embodiment is very similar to mounting assembly 130 as it is shown in FIG. 4. the primary difference is that mounting assembly 300 has a one-piece spacer 302 with integral body and support portions (304 and 314). In contrast, mounting assembly 130 has separate mounting member and support components (132 and 134). Accordingly, spacer 302 can be considered a combination of (1) a mounting member (such as mounting member 132) having an end contact surface (like opposite end surface 144) at the top end of body portion 304 at the juncture between body portion 304 and support portion 314, and (2) a support (like support 134) having a lower surface 315 (like lower surface 140).

Referring now to FIG. 7, a mounting assembly 400 includes a spacer 402 having a body portion 404 and an end portion 405. An opposite end portion 406 is positioned adjacent to mezzanine card 408 having a lower surface 410, a threaded opening 411, and an upper surface 412. Provided adjacent to opposite end portion 406 of spacer 402 is a head 414 which acts as a flange or support portion having a bottom contact surface 415 for abutment against an upper surface 412 of mezzanine card 408. External threads along an outer surface of the body portion 404 of spacer 402 engage with the female threads 411 provided in the threaded opening that extends through the mezzanine card 408. The mating of the threads of the spacer 402 and the threaded opening 411, as well as the contact between the bottom surface of head 414 and the upper surface 412 of the mezzanine card 408, provides means for engagement between the spacer and the mezzanine card. Such threaded engagement is another example of suitable means for engaging these components with respect to one another. A threaded nut 416 is optionally provided to lock the spacer 402 with respect to the mezzanine card 408. The lower end portion 405 of spacer 402 abuts against an upper surface 420 of circuit card 418. A screw 422 provides engagement between spacer 402 and circuit card 418, in a conventional manner. In this embodiment "400" of a mounting assembly according to this invention, the dimension $D_3$ defined in FIGS. 2 and 3 is also set by the distance between end portion 405 and the lower surface 415 of the spacer's head 414. Defining the distance $D_3$ in this manner eliminates any contribution to the tolerance attributable to variations in the thickness of mezzanine card 408.

It will be appreciated that the object of this invention will be achieved with additional variations and modifications of the embodiments selected for illustration. It will be further appreciated that each of the assembly components described herein can be substituted and exchanged for equivalent components and that the materials described herein can be substituted for equivalent materials. The right-angle connector assembly illustrated in FIGS. 2 and 3 can be substituted with other types of connector assemblies or any other assembly wherein the alignment feature of this invention is advantageous. Also, the mounting assembly embodiments illustrated in FIGS. 2–7 can take a wide variety of forms so long as the tolerance attributable to the mezzanine card substrate is eliminated. Also, various components of the mounting assembly can be combined to form integral components. Alternatively, components that are described as being in one piece can be separated into multiple components, if desired.

The fixed connections between the support components and the substrate can be replaced with a compliant connection so that the relative positions of the card portions can be varied to assist with connector alignment. For example, a support component of the mounting assembly can be placed in abutting (unattached) contact with a connector-mounting surface of the mezzanine card and a compression spring can be positioned between the card portions in order to urge the mezzanine card against the support in order to maintain it in position at the desired spacing. In other words, referring to FIG. 6, rivets 316 can be removed so that support 314 is movable with respect to mezzanine card 308, and a compression spring can be positioned between the circuit card (not shown) and the lower surface 310 of the mezzanine card 308 to urge mezzanine card 308 against the lower surface 315 of support 314. Such a structure would permit some floating adjustment of the position of the mezzanine card with respect to the circuit card while providing an "at rest" position with the desired card spacing. Although a fixed connection is preferred as described herein, such as a compliant connection can also be used to eliminate the effect of the tolerances attributable to the thickness of the card components.

The connectors (i.e., connectors 114 and 116) are illustrated on the upper surfaces of the respective circuit and mezzanine cards. It should be appreciated that other mounting surfaces are of course within the scope of the invention. The connector mounting surfaces can instead be oriented to face toward one another (i.e., surfaces 106 and 110 in FIG. 4), to face away from one another (i.e., surfaces 104 and 112 in FIG. 4), to face in the same direction (i.e., surfaces 106 and 112 in FIG. 4), or to face in the same but opposite direction (i.e., surfaces 104 and 110 in FIG. 4).

This invention is not limited to mezzanine connector assemblies specifically or to any other circuit card assemblies. Instead, the benefits conferred by the invention apply to any kind of assembly in which low-tolerance spacing between two spaced surfaces can be critical or advantageous.

What is claimed:

1. A circuit card assembly having connectors engageable to a mating connector assembly, said circuit card assembly comprising:
    a card portion having a surface on which a connector is mounted and a spaced card portion having a surface on which another connector is mounted, wherein said card portion and said spaced card portion are oriented in different planes; and
    a mounting member extending between said card portions to establish relative positions of said surfaces of said card portions, said mounting member comprising an end portion extending adjacent to the plane of one of said surfaces and an opposite end portion extending adjacent to the plane of the other one of said surfaces;
    wherein the distance between said surfaces of said card portions is set primarily by the distance between said end portions of said mounting member; and
    wherein said distance between said surfaces of said card portions is independent of the thickness of said card portions such that a variation of said thickness will not result in a variation of said distance between said surfaces of said card portions.

2. The circuit card assembly defined in claim 1, wherein one of said end portions of said mounting member extends adjacent to an opening defined in one of said card portions.

3. The circuit card assembly defined in claim 2, wherein said end portion of said mounting member extends at least partially through said opening.

4. The circuit card assembly defined in claim 1, said end portions of said mounting member each defining a contact surface aligned with said surface of one of said card portions, wherein said distance between said surfaces of said card portions corresponds to the distance between said contact surfaces defined by said end portions of said mounting member.

5. The circuit card assembly defined in claim 1, said mounting member further comprising a support member positioned adjacent to one of said end portions, said support member having a support surface positioned for engagement adjacent to said surface of one of said card portions along the plane of said surface.

6. The circuit card assembly defined in claim 5, wherein said support member is releasably engaged to said end portion of said mounting member.

7. The circuit card assembly defined in claim 5, wherein the distance between an opposite end portion of said mounting member and said support surface of said support member corresponds to said distance between said surfaces of said card portions.

8. The circuit card assembly defined in claim 5, wherein said engagement between said support surface of said support member and said surface of said card portion is provided by a mechanical fastener, a weld, or an adhesive.

9. A spacer for connecting spaced card portions of a circuit card assembly to establish relative positions between a card surface of one card portion on which a connector is mounted and a card surface of another card portion on which another connector is mounted, said spacer comprising:
    a body portion comprising an end portion positionable adjacent to one of said card surfaces and an opposite end portion positionable adjacent to the other one of said card surfaces; and
    a support portion connected adjacent to one of said end portions of said body portion and extending at an angle to said body portion, said support portion having a support surface positionable for engagement adjacent to one of said card surfaces along the plane of said card surface;
    wherein the distance between said support surface of said support portion and an opposite end portion of said body portion is set to establish a desired distance between said card surfaces independent of the thickness of said card portions, wherein a variation of said thickness of said card portions will not result in a variation of the distance between said card surfaces.

10. The spacer defined in claim 9, said opposite end portion of said body portion defining a contact surface for alignment with said surface of one of said card portions, wherein said distance between said surfaces of said card portions corresponds to the distance between said support surface and said contact surface.

11. The spacer defined in claim 9, wherein said support surface of said support portion is connected for contact with an end surface of said body portion, wherein said support surface and said end surface are oriented in substantially the same plane.

12. The spacer defined in claim 9, wherein said body portion of said spacer comprises a longitudinally extending standoff.

13. The spacer defined in claim 9, wherein said support portion is releasably engaged to said body portion.

14. The spacer defined in claim 9, wherein said support portion of said spacer comprises a substantially flat plate.

15. A circuit card assembly having connectors engageable to a mating connector assembly, said circuit card assembly being adapted to promote alignment between said connectors and said mating connector assembly, said circuit card assembly comprising:
    a card portion having a card surface on which a connector is mounted;
    a spaced card portion having a spaced card surface on which a spaced connector is mounted, wherein said spaced card portion and said card portion are oriented in different planes;
    a spacer extending between said card portion and said spaced card portion to establish relative positions of said card surface and said spaced card surface with respect to one another, said spacer comprising a body portion having an end portion extending adjacent to said card portion and an opposite end portion extending adjacent to said spaced card surface, said spacer further comprising a support portion positioned adjacent to said opposite end portion of said body portion and extending at an angle to said body portion, said support portion having a support surface abutting against said spaced card surface along the plane of said spaced card surface; and means for engaging said support portion of said spacer adjacent to said spaced card surface of said spaced card portion;

wherein the distance between said end portion of said body portion and said support surface of said support portion corresponds to the distance between said card surface and said spaced card surface; and wherein said distance between said card surface and said spaced card surface is independent of the thickness of said card portions such that a variation of said thickness of said card portions will not result in a variation of said distance between said card surface and said spaced card surface.

16. The circuit card assembly defined in claim 15, said body portion of said spacer further comprising a contact surface defined by said end portion, wherein said contact surface and said card surface are oriented in substantially the same plane.

17. The circuit card assembly defined in claim 15, wherein said support portion is releasably engaged to said opposite end portion of said body portion.

18. The circuit card assembly defined in claim 15, wherein said spaced card portion defines an opening and said body portion of said spacer extends into said opening.

19. The circuit card assembly defined in claim 15, wherein said means for engaging is selected from the group consisting of a mechanical fastener, a weld, and an adhesive.

20. The circuit card assembly defined in claim 15, wherein said means for engaging comprises a rivet.

21. A mezzanine connector assembly having connectors engageable to a mating connector assembly, said mezzanine connector assembly being adapted to promote alignment between said connectors and said mating connector assembly, said mezzanine connector assembly comprising:

a circuit card having a circuit card surface on which a circuit card connector is mounted;

a mezzanine card having a mezzanine card surface on which a mezzanine card connector is mounted, wherein said mezzanine card surface is oriented in a plane that is spaced from said circuit card surface;

a spacer extending for connection between said circuit card and said mezzanine card to establish relative positions of said circuit card surface and said mezzanine card surface with respect to one another, said spacer comprising a body portion having an end surface extending to the plane of said circuit card surface and an opposite end surface extending to the plane of said mezzanine card surface, said spacer further comprising a flange portion connected adjacent to said opposite end surface of said body portion and extending in a direction substantially perpendicular to said body portion, said flange portion having a flange surface abutting against said opposite end surface of said body portion and against said mezzanine card surface along the plane of said mezzanine card surface; and means for engaging said flange portion of said spacer adjacent to said mezzanine card surface of said mezzanine card;

wherein the distance between said end surface of said body portion and said opposite end surface of said body portion corresponds to the distance between said circuit card surface and said mezzanine card surface; and wherein said distance between said circuit card surface and said mezzanine card surface is independent of the thickness of said mezzanine card such that a variation of said thickness of said mezzanine card will not result in a variation of the distance between said circuit card surface and said mezzanine card surface.

22. The mezzanine connector assembly defined in claim 21, said means for engaging being selected from the group consisting of a mechanical fastener, a weld, and an adhesive.

23. The mezzanine connector assembly defined in claim 21, wherein said mezzanine card is oriented along a plane that is substantially parallel to said circuit card.

24. The mezzanine connector assembly defined in claim 21, wherein said mezzanine card surface faces in a direction away from said circuit card.

25. The mezzanine connector assembly defined in claim 21, wherein said circuit card surface faces in a direction toward said mezzanine card.

* * * * *